United States Patent
Seidl et al.

(10) Patent No.: US 9,483,033 B2
(45) Date of Patent: Nov. 1, 2016

(54) ALTERNATOR CONTROLLER AND SYSTEM AND METHOD FOR COMMUNICATING WITH AN ALTERNATOR CONTROLLER

(71) Applicant: Infineon Technologies AG, Neubiberg (DE)

(72) Inventors: Christoph Seidl, Graz (AT); Alexander Mori, Graz (AT); Markus Kovacs, Semriach (AT)

(73) Assignee: Infineon Technologies AG, Neubiberg (DE)

(*) Notice: Subject to any disclaimer, the term of this patent is extended or adjusted under 35 U.S.C. 154(b) by 240 days.

(21) Appl. No.: 14/252,903

(22) Filed: Apr. 15, 2014

(65) Prior Publication Data

US 2015/0295528 A1   Oct. 15, 2015

(51) Int. Cl.
| | |
|---|---|
| *G05B 11/00* | (2006.01) |
| *H03M 5/16* | (2006.01) |
| *H03M 5/20* | (2006.01) |
| *H02P 9/48* | (2006.01) |

(52) U.S. Cl.
CPC .......... *G05B 11/00* (2013.01); *H03M 5/16* (2013.01); *H03M 5/20* (2013.01); *H02P 9/48* (2013.01)

(58) Field of Classification Search
CPC  G08C 15/08; H03M 5/16–5/20; H03M 9/00
USPC .............. 322/89; 341/56, 57; 710/71, 307
See application file for complete search history.

(56) References Cited

U.S. PATENT DOCUMENTS

| | | | | |
|---|---|---|---|---|
| 5,473,635 A | * | 12/1995 | Chevroulet | G06F 13/4072 341/56 |
| 7,016,770 B2 | * | 3/2006 | Pfaffeneder | B60R 16/0315 340/534 |
| 7,028,105 B2 | * | 4/2006 | Dute | G05B 19/0423 326/30 |

* cited by examiner

*Primary Examiner* — Howard Williams
(74) *Attorney, Agent, or Firm* — Viering, Jentschura & Partner mbB

(57) ABSTRACT

According to various examples, alternator controllers, systems for communicating with an alternator controller and methods for communicating with an alternator regulator are described herein. As an example, the alternator controller includes an input terminal configured to be coupled to a coil of a stator of an alternator and an interface circuit coupled to the input terminal and configured to convert a multi-valued signal at the input terminal into parallel signals. According to another example, a system for communicating with an alternator controller is described herein. This example includes a device and an alternator controller. The device includes an encoder. The alternator controller includes a decoder and at least one phase terminal. The encoder and the decoder are coupled via the at least one phase terminal of the alternator controller.

19 Claims, 4 Drawing Sheets

ALTERNATOR CONTROLLER AND SYSTEM AND METHOD FOR COMMUNICATING WITH AN ALTERNATOR CONTROLLER

TECHNICAL FIELD

Various embodiments relate generally to alternator controllers, for example automotive alternator controllers, and to systems and methods for communicating with an alternator controller.

BACKGROUND

An alternator regulator may control or regulate the output voltage of an alternator, for example by controlling the current through the coil of the rotor of the alternator. Low-end alternator regulators may output a lamp signal at the dashboard and may provide a Field Monitor (FM) signal, which mirrors the rotor current, to an engine control unit (ECU). High-end alternator regulators may have a communication interface, such as a Local Interconnect Network (LIN), which is a single-wire bus transmitter and receiver, to communicate with the engine control unit.

Both low-end and high-end alternator regulators may be small systems-on-a-chip (SoC). Default parameters may be stored on the chip to match the control characteristics of the alternator regulator to the alternator, the engine and the on-board electrical loads. High-end alternator regulators may provide a non-volatile memory (NVM), such as for example Electrically Erasable Programmable Read-Only Memories (EEPROM, E²PROM), to store the parameters. However, the maximum data rate of 19.2 kbits/s of the LIN-interface may lead to unacceptable long times for testing or programming the alternating regulator. For low-end alternator regulators, wire bonding may be used to set the parameters if the alternator regulator is delivered as a bare-die. However, this will not be possible if the alternator regulator is delivered in a package. In this case, it is desired that low-end alternator regulators may also be configured using NVM.

The packages of alternator regulators may have a limited number of pins (or terminals), for example a pin "BA" for battery/alternator voltage, a pin "GND" for ground potential, one or two pins "PH1, PH2" connected to respective coils of the stator of the alternator, a pin "LT" to output a lamp signal, a pin "RVS" for a regulation voltage select, a pin "EXC" to output an excitation current to the rotor coil, and a pin "FM" for the field monitor signal of low-end alternator regulators or a pin "LIN" for the local interconnect network for high-end alternator regulators. For reasons of cost, it is desired to not increase the number of pins.

Because of the small number of pins available, it is not possible to implement a high-speed interface, such as a Controller Area Network (CAN) or a Serial Peripheral Interface Bus (SPI). However, it is desired to provide a fast interface for both low-end and high-end alternator controllers.

SUMMARY

According to one embodiment, an alternator controller is described herein. The alternator controller includes at least one input terminal and an interface circuit. The least one input terminal is configured to be coupled to a coil of a stator of an alternator. The interface circuit is coupled to the least one input terminal. The interface circuit is configured to convert a multi-valued signal at the least one input terminal into parallel signals.

According to another embodiment, a system, for example for communicating with an alternator controller is described herein. The system includes a device and an alternator controller. The device includes an encoder. The alternator controller includes a decoder and at least one phase terminal. The encoder and the decoder are coupled via the at least one phase terminal of the alternator controller.

According to still another embodiment, a method for communicating with an alternator regulator is described herein. The method includes transmitting a multi-valued signal to the alternator regulator via at least one phase terminal of the alternator regulator. The method further includes decoding the transmitted multi-valued signal into signals of a serial peripheral interface of the alternator regulator.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the drawings, the left-most digit(s) of a reference number may identify the drawing in which the reference number first appears. The same numbers may be used throughout the drawings to reference like features and components. In the following description, various embodiments of the invention are described with reference to the following drawings, in which.

DETAILED DESCRIPTION

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

Figure 1:
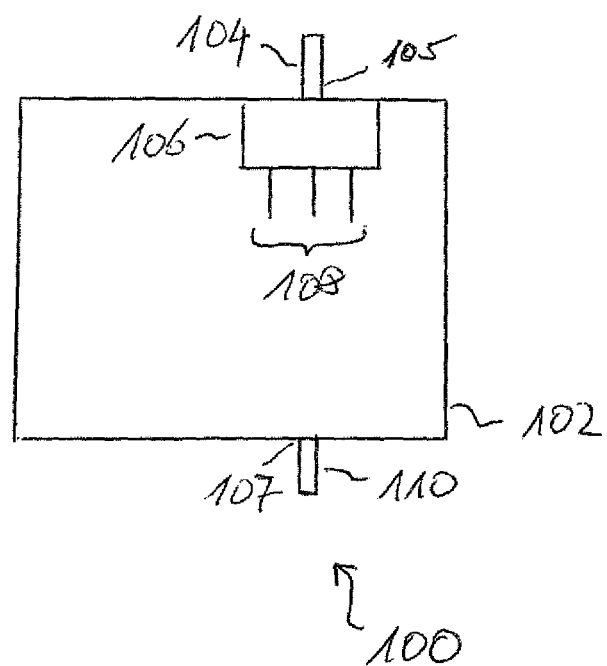
FIG. 1 shows an embodiment of an alternator controller.

FIG. 1 shows an embodiment 100 of an alternator controller (also known as alternator regulator or voltage regulator or voltage controller) 102. The alternator controller 102 may control or regulate a voltage in a system of an alternator, a battery and electrical loads. The alternator may be driven, for example by a combustion engine, to provide electrical power to charge the battery and to provide energy to the electrical loads. The alternator controller 102 may be provided in a package, that is, the chip-die may be electrically connected to a lead frame and encapsulated. It may only be accessible by the pins (or terminals) of the lead frame.

The alternator controller 102 may include at least one input terminal, even though FIG. 1 illustrates only one input terminal 104. The input terminal 104 may be configured to be coupled to a coil of a stator of the alternator. It may be configured for measuring a signal from one of the coils (or phases) of the stator of the alternator from which the alternator rotor speed and the stator voltage can be determined. The input terminal 104 may be the phase terminal PH1 or PH2 described in the background section.

The input terminal 104 may have a high impedance. Consequently, a signal applied to the input terminal 104 will not be significantly altered as it is not loaded, for example by electronics or electrical loads inside the alternator controller 102 which are connected to the input terminal 104. The values of a multi-valued signal applied to the input terminal 104 are therefore easily distinguished from each other since the multi-valued signal is not unduly loaded. While a binary signal, which is a two-valued signal, may be robust against loading, that is, it may still be possible to distinguish between the two values when the binary signal is loaded, distinguishing the values of a multi-valued signal with three or four or more values may be more difficult when the multi-valued signal is loaded. The phase terminal PH1 may have a high impedance to allow an accurate measuring of the phase voltage.

Other terminals or pins of the alternator controller 102, which are described in the background section, need not have a high impedance. They may therefore load a multi-valued signal applied to them. However, the alternator controller 102 may have another input terminal PH2 that may be configured in the same manner as the input terminal 104. The another input terminal PH2 may be configured for measuring a signal from another one of the phases of the stator of the alternator. It may have a high impedance. One of the input terminal PH1 and the another input terminal PH2 may be used for measuring the phase of a stator and the other one may be used for applying the multi-valued signal. Alternatively, a respective multi-valued signal may be applied to each of the input terminal PH1 and the another input terminal PH2.

The alternator controller 102 may include an interface circuit 106 (or decoder). The interface circuit 106 may be coupled to the input terminal 104. In other words, input terminal 104 may be an input 105 of the interface circuit 106. The interface circuit 106 may be configured to convert a multi-valued signal PH applied at the input terminal 104 into parallel signals 108. A parallel signal may simultaneously communicate signals over more than one electrical conductor, terminal or pin.

In various embodiments, the alternator controller 102 may further include an output terminal (or an I/O pin) 110. The output terminal 110 may be a local interconnect network (LIN) terminal (or pin) of a high-end alternator regulator. It may also be a field monitor (FM) terminal (or pin) of a low-end alternator controller 102. An output 107 of the alternator controller 102 may be applied to the output terminal 110.

A serial peripheral interface (SPI, also called Synchronous Serial Interface SSI) bus may have four lines (or wires), which may connect a slave and a master. A slave may have three input lines, one for the signal "clock" CLK (also known as serial-clock SCLK, SCK), the signal "serial-out" SO (also known as master-output-slave-input MOSI, SIMO, serial-data-out SDO, data-out DO, master-transmit-slave-receive MTSR) and the signal "chip-select" CS (also known as slave-select SS, slave-transmit-enable STE). The three input lines of the slave may form three output lines of the master. A slave may have an output line for the signal "serial-in" SI (also known as master-in-slave-output MISO). The output line of the slave may form the input line of the master. The serial peripheral interface bus is a synchronous serial bus and the data rate may be set by the frequency of the clock CLK. Full duplex communication between the master and the slave is possible.

In various embodiments, the parallel signals 108 converted by the interface circuit 106 may be configured as the signals clock (CLK), serial-out (SO) and chip-select (CS) of a serial peripheral interface bus. A signal applied at the output terminal 110 may be configured as the signal serial-in (SI) of the serial peripheral interface bus. The parallel signals 108 and the signal at the output terminal 110 may thus present the four lines needed for a serial peripheral interface bus and may be used to communicate with the alternator controller 102 using the serial peripheral interface protocol.

Figure 2:
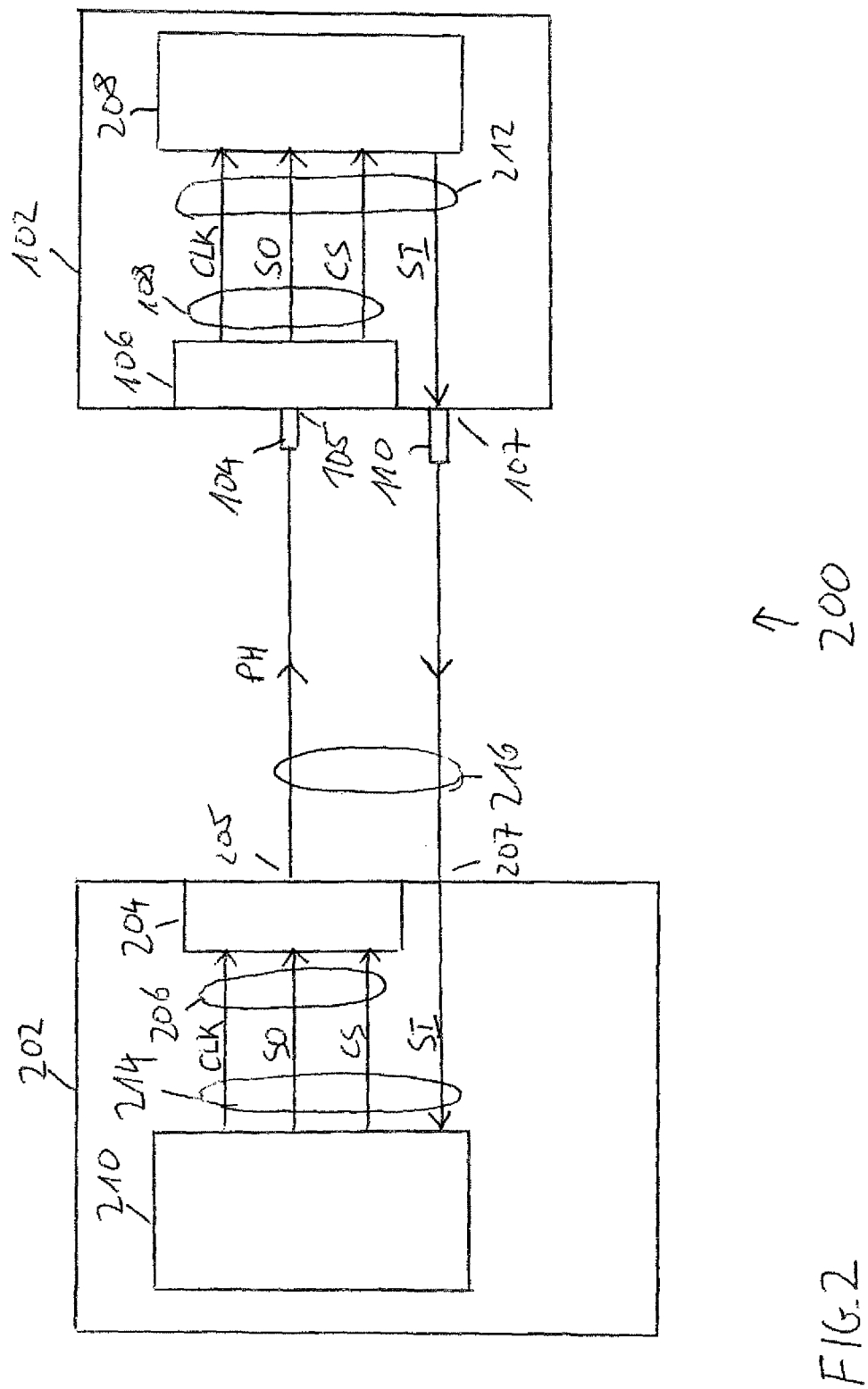
FIG. 2 shows an embodiment of a system for communicating with an alternator controller.

FIG. 2 shows an embodiment 200 of a system, for example for communicating with an alternator controller 102. The system may include a device 202 and an alternator controller 102. The device 202 may include an encoder 204. The alternator controller 102 may be the same as was described in conjunction with FIG. 1, so that the features described there may also apply here and vice versa. It may include a decoder (or interface circuit) 106. The encoder 204 and the decoder 106 may be coupled via at least one phase terminal (or input terminal) 104 of the alternator controller 102. In other words, a wire (or line) may connect an output 205 of the encoder 204 to the at least one phase terminal 104. The at least one phase terminal 104 may be connected to an input 105 of the decoder 106. While only one phase terminal 104 is shown, the device 202 and the alternator controller 102 may also communicate over two phase terminals PH1, PH2.

In various embodiments, the encoder 204 may be configured to convert a parallel signal 206 into a multi-valued signal PH. In various embodiments, the parallel signal 206 may include three parallel signals. The parallel signal 206 may be the signals clock CLK, serial-out SO and chip-select CS of a serial peripheral interface 214. In various embodiments, the multi-valued signal PH may be a four-valued signal, for example a voltage signal. However, the multi-valued signal PH may also have a different number of distinct values, for example three or five or more. The number of distinct values may depend on the number of phase terminals 104 used for communication. If two phase terminals 104 are used for communication, the number of values may for example be three.

Figure 3:
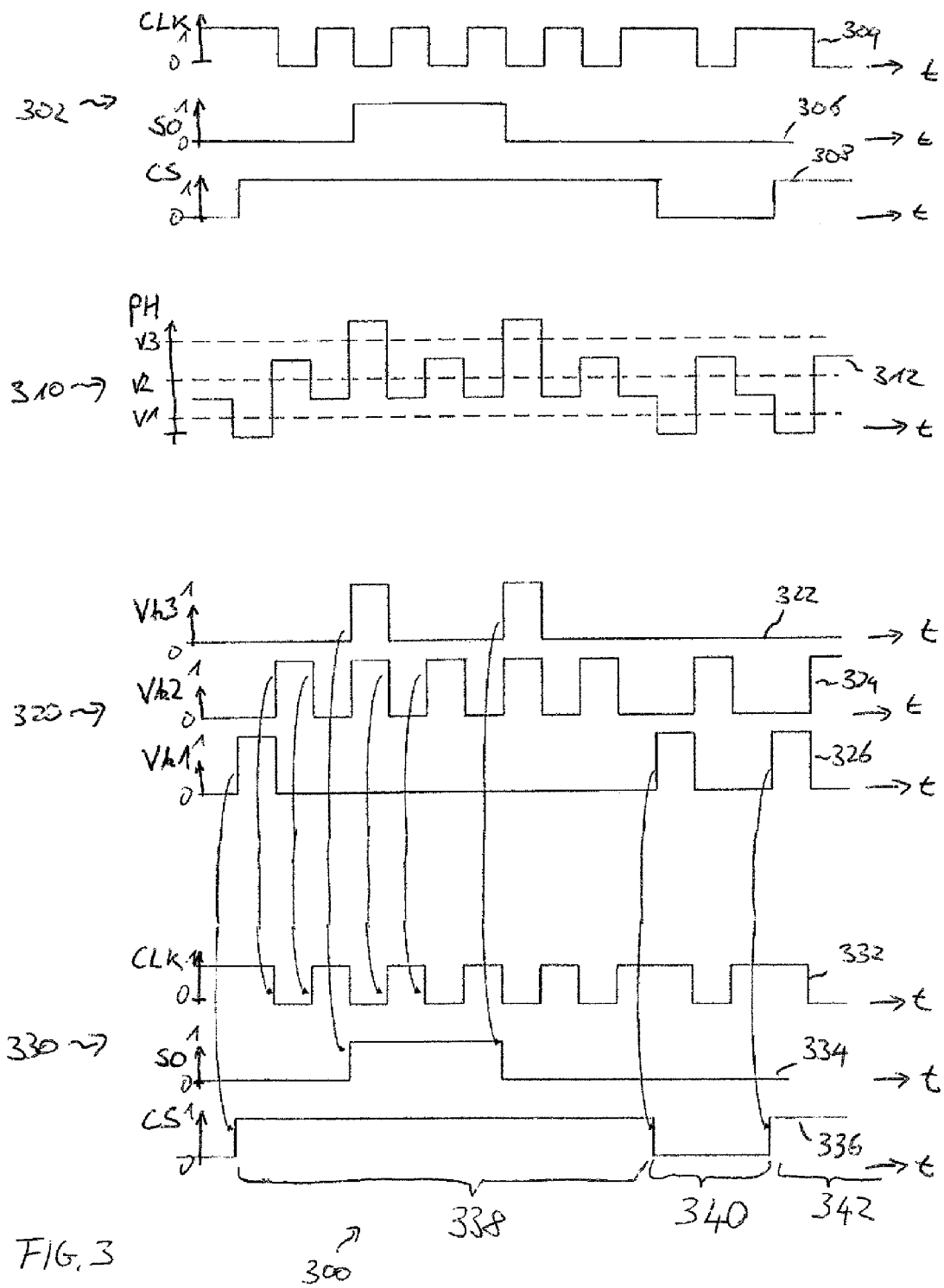
FIG. 3 shows an embodiment of diagrams with waveforms of signals suitable for communicating with an alternator controller.

In various embodiments, the encoder 206 may include a software controlled voltage source. For example, the encoder 206 may be a voltage source programmed to output distinct voltage levels, for example four voltage levels, depending on the state of the signals CLK, SO and CS. The signals CLK, SO and CS may be output by a device circuit 210. The device circuit 210 may be any kind of circuit with a serial peripheral interface. The software may be used to combine the state of the signals CLK, SO and CS to form a control signal for the voltage source. Alternatively, the encoder 206 may include voltage sources coupled in series with each other which are activated by means of switches. The switches may be controlled by the state of the signals CLK, SO and CS. Software or a logic circuits may be used to combine the states of the signals CLK, SO and CS into control signals for the switches. Diagrams 302 and 310 of FIG. 3 shows an example of how the signals CLK, SO and CS output by the device circuit 210 may be encoded to obtain a four-valued signal PH.

In various embodiments, the decoder 104 may be configured to convert the multi-valued signal PH into a parallel signal 108. In various embodiments, the parallel signal 108 may include three parallel signals. The parallel signals 108 may be the signals clock CLK, serial-out SO and chip-select CS of a serial peripheral interface 212. The serial peripheral interface 212 may be part of the regulator circuit 208.

In various embodiments, the decoder 106 may include a plurality of comparators. For example, a four-valued signal PH may be decoded by three comparators. Diagrams 310 and 320 of FIG. 3 show an example of how the four-valued signal PH may be decoded by three comparators. The output of the comparators may be further processed, for example by software or by a logic circuit, to obtain signals CLK, SO and CS, see diagram 330 of FIG. 3.

In various embodiments, the device 202 and the alternator controller 102 may be further coupled via a terminal, for example via an output terminal or I/O-pin or I/O-terminal, 110 of the alternator controller 102. The alternator controller 102 may apply an output 107 at the output terminal 110. The output terminal 110 may be coupled to the regulator circuit 208, for example without passing through the decoder 106. In various embodiments, the output terminal 110 of the alternator controller 102 may be a local interconnect network (LIN) terminal or a field monitor (FM) terminal. The device 202 may have an input 207 which may be directly coupled to the output terminal 110, for example via a wire. The input 207 may be coupled to the device circuit 210, for example without passing through the encoder 204. In other words, the device circuit 210 and the regulator circuit 208 may be directly connected to each other via the output terminal 110 without passing through the encoder 204 or the decoder 106.

The device circuit 210 may have an SPI-bus interface 214. The regulator circuit 208 may have an SPI-bus interface 212. Parallel signals 206, for example the three signals CLK, SO and CS of the SPI-bus interface 214 may be encoded by the encoder 204 into a four-valued signal PH. The four-valued signal PH may be transmitted via a high impedance input, for example a terminal (or pin) 104 used for measuring a phase signal of the alternator, to the decoder 106. After transmission, the four-valued signal PH may be decoded by the decoder 106 into parallel signals 108, for example into the three signals CLK, SO and CS of the SPI-bus interface 212. An output terminal (or pin) 110 of the alternator regulator 102, such as terminal (or pin) FM for a low-end alternator regulator or terminal (or pin) LIN for a high-end alternator regulator, may be used for transmitting the serial-in SI signal from the alternator regulator 102 to the device 202. The serial-in SI signal does not need to be encoded and decoded; it may be transmitted unchanged. In other words, signal SI of the SPI-bus interface 212 may be transmitted directly as signal SI of the SPI-bus interface 214.

The SPI-bus interface 212 and the SPI-bus interface 214 may be regarded as being part of the same SPI-bus, with the device circuit 210 being the master and the regulator circuit 208 being the slave of the SPI-bus. The signals CLK, SO and CS of the SPI-bus may be encoded into the four-valued signal PH so that they can be transmitted over just one terminal (or pin) 104. In this manner, an interface 216 having only two wires (or lines) is formed. Only two pins (input pin 104 and output pin 110) of the alternator regulator 102 are needed to allow SPI-bus communication. The alternator regulator 102 may be packaged, and while being only accessible by its pins, it is still open for SPI-bus communication.

In various embodiments, the device 202 may be a test signal generator. The test signal generator may be configured to send test data (or test patterns) to the alternator regulator 102 via the interface 216 made up of the input pin 104 and the output pin 110. The device circuit 210 may include a pattern generator that may generate test patterns and provide them at SPI-bus 214. The test patterns may be encoded by the encoder 204 and may be transmitted over the interface 216. They may be received by the alternator regulator 102 and may be decoded by the decoder 106. The alternator regulator 102 may process the test data, for example by the regulator circuit 208, and may provide a test result at the interface 212. The test signal generator may receive the test result from the alternator regulator 102 and may evaluate if the alternator regulator 102 (or the regulator circuit 208) is working correctly. The data rate of the SPI-bus 212, 214 may be chosen high enough to allow a complete and fast testing of the alternator regulator 102.

In various embodiments, the device 202 may be a programming device. The programming device 202 may be configured to program the alternator regulator 102, for example to set parameters of the regulator circuit 208. The parameters may be stored in a non-volatile memory, which may, for example, be arranged on the regulator circuit 208. The data rate of the SPI-bus 212, 214 may be chosen high enough so that all parameters of the alternator regulator 102 can be programmed in a short time.

In various embodiments, the device 202 may be an engine control unit (ECU). The engine control unit may communicate with the alternator regulator 102 using the SPI-interface 212, 214.

The alternator regulator 102 may include a switch coupled to the input terminal 102. In a first position, the switch may couple the input 105 to the encoder 106, as was described above. The alternator regulator 102 may then communicate with the device 202. In a second position, the switch may couple the input 105 directly to the regulator circuit 208. The decoder 106 may be bypassed. The phase of the stator of the alternator may be measured, for example to determine the alternator rotor speed and the stator voltage. In this case, the alternator regulator 102 may control or regulate the voltage in the system of the alternator, the engine and the on-board electrical system. In other words, when the switch is in the first position, the alternator regulator 102 may be programmed or tested and when the switch is in the second position, the alternator regulator 102 may be used as an ordinary alternator regulator. A switch may not be necessary if two phase terminals are used, one for communicating and one for measuring the phase of the stator.

FIG. 3 shows an embodiment 300 with diagrams 302, 310, 320 and 330. The description of the diagrams 302, 310, 320 and 330 may apply to the embodiments 100 and 200 of FIG. 1 and FIG. 2 and vice versa.

Diagram 302 shows a waveform 304 of the signal clock CLK, a waveform 306 of the signal serial-out SO and a waveform 308 of the signal chip-select CS over time t. The signals CLK, SO and CS may be part of the signals of an SPI-bus, for example of SPI-bus 214. They may be the parallel signal 206 provided by the device circuit 210 of the device 202 and may be used as an input to the encoder 204. The signals CLK, SO and CS may be digital signals, that is, binary signals having a high state ("H" or "1") and a low state ("L" or "0").

Diagram 310 shows a waveform 312 of the multi-valued signal PH over time t. Signal PH may be available at an output 205 of the encoder 204 and may depend on the states (or values) of the signals CLK, SO and CS that are input to the encoder 204. The encoder 204 may transform the signals CLK, SO and CS into a four-valued signal PH. However, the signals may also be transformed into a different number of values.

A four-valued signal may have four distinct signals. Signal PH may have a first value, which may be any value below a first threshold V1. It may have a second value, which may be any value between the first threshold V1 and a second threshold V2. It may have a third value, which may be any value between the second threshold V2 and a third threshold V3. Signal PH may have a fourth value, which may be any value above the third threshold V3. Signal PH may for example be a voltage. The first threshold V1 may for example be V1=1 V, the second threshold V2 may for example be V2=4 V and the third threshold V3 may for example be V3=7 V.

Diagram 302 and 310 illustrate how the four-values of signal PH may be coded depending on the states of the signals CLK, SO and CS. A transition of signal CS from low to high may be coded as the first value, that is as a value falling below the first (and lowest) threshold V1. A transition of signal CS from high to low may again be coded as the first value. A transition of signal SO from low to high may be coded as the fourth value, that is as a value above the third (and highest) threshold V3. A transition of signal SO from high to low may again be coded as the fourth value. A high signal CLK may be coded as the second value and a low signal CLK may be coded as the third value when the signals CS and SO are not in transition. When the signals CS and SO are in transition, their coded values may override the coded value of the signal CLK.

Signal PH may be transmitted to the decoder 106 of the alternator regulator 102 via the input terminal 104 and may be used as an input 105 to the decoder 106. In this way, the three signals CLK, SO and CS are transferred (or transmitted) as a single four-valued signal PH over just one pin of the alternator regulator 102. The decoder 106 may be configured to recover the signals CLK, SO and CS from the four-valued signal PH, for example using three comparators. Signal PH may be applied to the respective inputs of the comparators. Diagram 310 and 320 illustrate how the four-value signal PH may be decoded by the comparators.

Diagram 320 shows a waveform 322 of a signal Vk3, a waveform 324 of a signal VI(2 and a waveform 326 of a signal Vk1 over time t. Waveform 326 may be the output of a first comparator. The first comparator may have a first threshold T1, for example T1=1 V. It may output a signal Vk1 if the four-valued signal PH is below the first threshold T1. Waveform 324 may be the output of a second comparator. The second comparator may have a second threshold T2, for example T2=4 V. It may output a signal Vk2 if the four-valued signal PH is above the second threshold T2. Waveform 322 may be the output of a third comparator. The third comparator may have a third threshold T3, for example T3=7 V. It may output a signal Vk3 if the four-valued signal PH is above the third threshold T3. The output Vk1, Vk2 and Vk3 of the comparators may be digital, that is having a high state ("H" or "1") and a low state ("L" "0"). The thresholds T1, T2 and T3 of the comparators may be the same as the thresholds V1, V2 and V3 used for encoding the signals CLK, SO and CS. However, they may also be different, as long as the first value, the second value, the third value and the fourth value of signal PH can be detected.

Diagram 330 shows a waveform 332 of signal CLK, a waveform 334 of signal SO and a waveform 336 of signal CS over time t. Signals CLK, SO and CS may be processed from the outputs Vk1, Vk2 and Vk3 of the comparators as follows: A transition of signal Vk1 from low to high may lead to a change in state of signal CS. A transition of signal Vk2 from low to high may lead to a transition of signal CLK from high to low. A transition of signal Vk2 from high to low may lead to a transition of signal CLK from low to high. A transition of signal Vk3 from low to high may lead to a change in state of signal SO. The processing of Vk1, Vk2 and Vk3 to obtain signals CLK, SO and CS may be realized using software or a logic circuit.

The signals CLK, SO and CS of diagram 330 may be part of the signals of an SPI-bus, for example of SPI-bus 212. They may form the parallel signal 108 output by the decoder 106. The signals CLK, SO and CS of the parallel signal 108 may have the same values as the signals CLK, SO and CS of the parallel signal 206. Together with signal SI, which connects the device circuit 210 and the regulator circuit 208, communication between the device 202 and the alternator regulator 102 using the SPI-bus may be possible. The SPI-bus may have a data rate that is 200 larger than that of a LIN-bus.

The encoding and decoding of the parallel signals into the multi-valued signal and vice versa is not limited to the encoding and decoding described above. The signals CLK, SO and CS may be coded using different conditions for the transitions, using inverted signals or different first values, second values, third values and fourth values.

The embodiments 100, 200 and 300 shown in FIGS. 1 to 3 may also be used for scan tests. The signals CLK and SO may be coded and decoded as described above. However, since only one slave (here the alternator regulator) is used, the chip-select signal CS is not really required. It may therefore be used to start a scan pattern and to change between a shift and a capture phase of the test. For example, as is shown in waveform 336 of diagram 330, a transition of signal CS from low to high may start a shift (or load) interval 338. During a load interval, which may for example last several hundred cycles of the clock signal CLK, test patterns may be transmitted to the regulator circuit 208, for example using signal SO. The test pattern may be stored (or loaded) in registers, for example in cells of a scan chain. A transition of signal CS from high to low may end the load interval 338 and start a capture (or launch) interval 340. During a capture interval, one or more clock cycles CLK of normal operation may be applied to the regulator circuit 208 and a response of the regulator circuit 208 to the test pattern may be captured. A transition of signal CS from low to high may end the capture interval 340 and may start another shift (or load) interval 342. During a load interval, the captured response may be shifted out of the registers (also called chain unload) and be compared to expected values. While the response data is shifted out of the registers, the registers may be simultaneously be loaded by the next test pattern.

Figure 4:
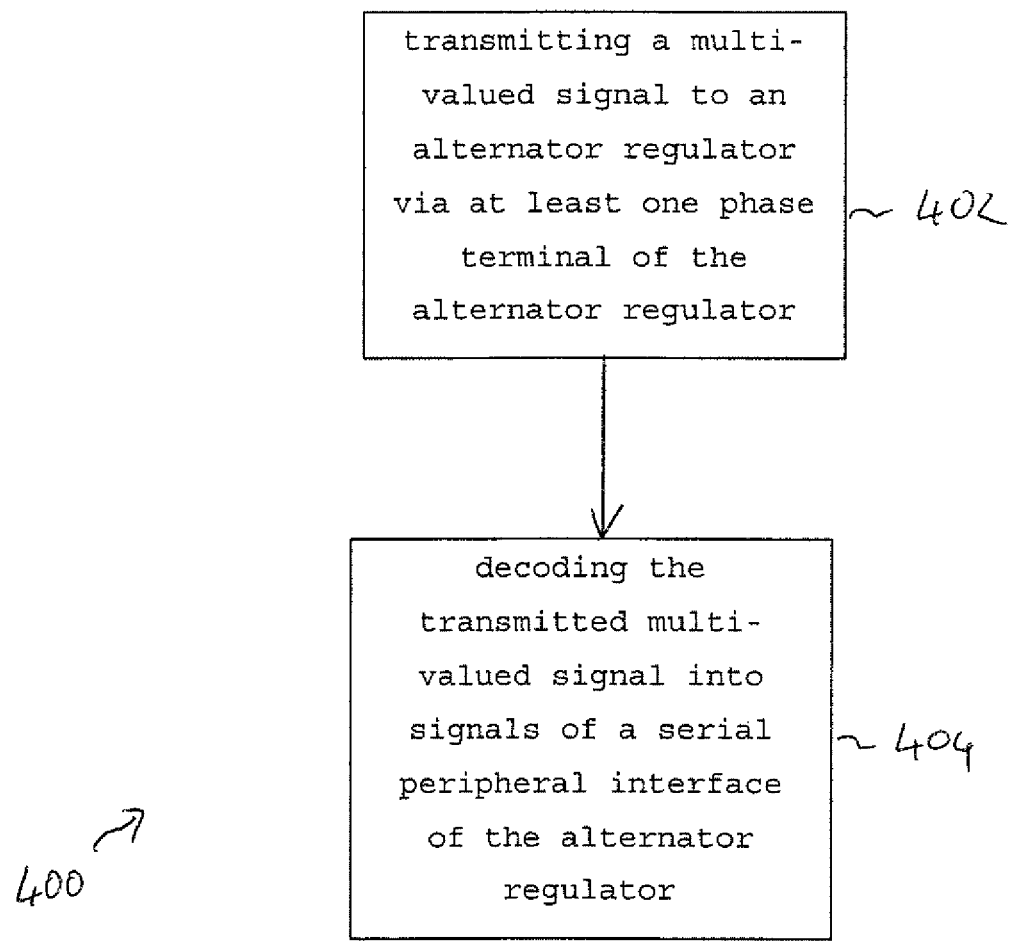
FIG. 4 shows an embodiment of a method for communicating with an alternator controller.

FIG. 4 shows an embodiment 400 of a method for communicating with an alternator regulator. The method may include a step 402 of transmitting a multi-valued signal to the alternator regulator via at least one phase terminal of the alternator regulator. The method may further include a step 404 of decoding the transmitted multi-valued signal into signals of a serial peripheral interface of the alternator regulator.

In various embodiments, the method may further include encoding signals of a serial peripheral interface, for example of SPI-bus 214, into the multi-valued signal.

In various embodiments, the method may further include encoding the signals clock CLK, serial-out SO and chip-select CS of the serial peripheral interface, for example of SPI-bus 214, into the four-valued signal, for example PH.

In various embodiments, encoding the signals clock CLK, serial-out SO and chip-select CS of a serial peripheral interface into a four-valued signal may include controlling a voltage source by software.

In various embodiments, the method may further include transmitting a signal serial-in SI of the serial peripheral interface, for example of SPI-bus 212, from the alternator regulator, for example via at least one output terminal of the alternator regulator.

In various embodiments, the signal serial-in SI from the serial peripheral interface of the alternator regulator is transmitted via a local interconnect network terminal, for example terminal LIN, of the alternator regulator or a field monitor terminal, for example terminal FM, of the alternator regulator.

In various embodiments, the method may further include testing a functionality of the alternator regulator by using the multi-valued signal for communicating test signals. The chip-select signal CS may be used to start a scan pattern and to change between a shift and a capture phase of the test.

In various embodiments, the method may further include programming the alternator regulator by using the multi-valued signal for communicating programming data.

While the embodiments have been described using a SPI-bus, other buses may also be used. Parallel signals of these buses may encoded in a multi-valued signal. The multi-valued signal may be transmitted using less wires than the number of parallel signals. After transmission, the multi-valued signal may be decoded to obtain the parallel signals.

While the embodiments have been described using a alternator regulator, the method and the communication structure may also be used for other electronic devices, for example electronic devices having a limited number of pins (or terminals).

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

Alternately and/or additionally, the scope of the disclosure is specifically intended to include without limitation at least the embodiments described in the enumerated clauses below. Equivalents thereof are also explicitly embraced.

1. An alternator controller, comprising:
    at least one input terminal configured to be coupled to a coil of a stator of an alternator; and
    an interface circuit coupled to the at least one input terminal and configured to convert a multi-valued signal at the at least one input terminal into parallel signals.
2. The alternator controller of clause 1, further comprising:
    an output terminal, wherein the output terminal is one of the following:
        a local interconnect network terminal of the alternator controller; and
        a field monitor terminal of the alternator controller.
3. The alternator controller of clause 2, wherein
    the parallel signals comprises three signals, wherein the three signals are configured as signals clock, serial-out and chip-select of a serial peripheral interface; and
    wherein the alternator controller is configured to apply a signal that is configured as a signal serial-in of the serial peripheral interface at the output terminal.
4. A system, comprising:
    a device; and
    an alternator controller; wherein
    the device comprises an encoder;
    the alternator controller comprises a decoder and at least one phase terminal;
    wherein the encoder and the decoder are coupled via the at least one phase terminal of the alternator controller.
5. The system of clause 4, wherein
    the device and the alternator controller are directly coupled via a terminal of the alternator controller, wherein the terminal of the alternator controller is one of:
        a local interconnect network terminal; and
        a field monitor terminal.
6. The system of clause 5, wherein
    the alternator controller is configured to apply a signal configured as signal serial-in of a serial peripheral interface at the terminal; and
    the device is configured to receive the signal serial-in.
7. The system of one of clauses 4 to 6, wherein
    the encoder is configured to convert a parallel signal into a multi-valued signal; and
    the decoder is configured to convert the multi-valued signal into a parallel signal.
8. The system of clause 7, wherein
    the parallel signal comprises the signals clock, serial-out and chip-select of a serial peripheral interface.
9. The system of clause 7 or 8, wherein
    the encoder comprises a software controlled voltage source.
10. The system of one of clauses 7 to 9, wherein
    the multi-valued signal is a four-valued voltage signal.
11. The system of one of clauses 7 to 10, wherein
    the decoder comprises a plurality of comparators.
12. The system of one of clauses 7 to 11, wherein
    the device is at least one of:
        a test signal generator configured to send test data to the alternator regulator and to receive test results from the alternator regulator;
        a programming device configured to program the alternator regulator; and
        an engine control unit.
13. A method for communicating with an alternator regulator, comprising:
    transmitting a multi-valued signal to the alternator regulator via at least one phase terminal of the alternator regulator; and
    decoding the transmitted multi-valued signal into signals of a serial peripheral interface of the alternator regulator.
14. The method of clause 13, further comprising:
    encoding signals of a serial peripheral interface into the multi-valued signal.
15. The method of clause 13 or 14, wherein
    the signals of the serial peripheral interface are signals clock, serial-out and chip-select; and
    the multi-valued signal is a four-valued signal.
16. The method of clause 14, wherein:
    encoding signals clock, serial-out and chip-select into a four-valued signal comprises controlling a voltage source by software.
17. The method of one of clause 13 to 16, further comprising:
    transmitting a serial-in signal of the serial peripheral interface by the alternator regulator.

18. The method of clause 17, wherein
the signal serial-in is transmitted via at least one of:
a local interconnect network terminal of the alternator regulator; and
a field monitor terminal of the alternator regulator.
19. The method of one of clauses 13 to 18, further comprising:
testing a functionality of the alternator regulator by using the multi-valued signal for communicating test signals.
20. The method of one of clauses 13 to 19, further comprising:
programming the alternator regulator by using the multi-valued signal for communicating programming data.

What is claimed is:

1. An alternator controller, comprising:
at least one input terminal configured to be coupled to a coil of a stator of an alternator;
an output terminal, wherein the output terminal is one of either a local interconnect network terminal of the alternator controller or a field monitor terminal of the alternator controller; and
an interface circuit coupled to the at least one input terminal and configured to convert a multi-valued signal at the at least one input terminal into parallel signals.

2. The alternator controller of claim 1, wherein
the parallel signals comprises three signals, wherein the three signals are configured as signals clock, serial-out and chip-select of a serial peripheral interface; and
wherein the alternator controller is configured to apply a signal that is configured as a signal serial-in of the serial peripheral interface at the output terminal.

3. A system, comprising:
a device; and
an alternator controller; wherein
the device comprises an encoder;
the alternator controller comprises a decoder and at least one phase terminal;
wherein the encoder and the decoder are coupled via the at least one phase terminal of the alternator controller.

4. The system of claim 3, wherein
the device and the alternator controller are directly coupled via a terminal of the alternator controller, wherein the terminal of the alternator controller is one of:
a local interconnect network terminal; and
a field monitor terminal.

5. The system of claim 4, wherein
the alternator controller is configured to apply a signal configured as signal serial-in of a serial peripheral interface at the terminal; and
the device is configured to receive the signal serial-in.

6. The system of claim 3, wherein
the encoder is configured to convert a parallel signal into a multi-valued signal; and
the decoder is configured to convert the multi-valued signal into a parallel signal.

7. The system of claim 6, wherein
the parallel signal comprises the signals clock, serial-out and chip-select of a serial peripheral interface.

8. The system of claim 6, wherein
the encoder comprises a software controlled voltage source.

9. The system of claim 6, wherein
the multi-valued signal is a four-valued voltage signal.

10. The system of claim 6, wherein
the decoder comprises a plurality of comparators.

11. The system of claim 3, wherein
the device is at least one of:
a test signal generator configured to send test data to the alternator regulator and to receive test results from the alternator regulator;
a programming device configured to program the alternator regulator; and
an engine control unit.

12. A method for communicating with an alternator regulator, comprising:
transmitting a multi-valued signal to the alternator regulator via at least one phase terminal of the alternator regulator; and
decoding the transmitted multi-valued signal into signals of a serial peripheral interface of the alternator regulator.

13. The method of claim 12, further comprising:
encoding signals of a serial peripheral interface into the multi-valued signal.

14. The method of claim 13, wherein
the signals of the serial peripheral interface are signals clock, serial-out and chip-select; and
the multi-valued signal is a four-valued signal.

15. The method of claim 14, wherein:
encoding signals clock, serial-out and chip-select into a four-valued signal comprises controlling a voltage source by software.

16. The method of claim 12, further comprising:
transmitting a serial-in signal of the serial peripheral interface by the alternator regulator.

17. The method of claim 16, wherein
the signal serial-in is transmitted via at least one of:
a local interconnect network terminal of the alternator regulator; and
a field monitor terminal of the alternator regulator.

18. The method of claim 12, further comprising:
testing a functionality of the alternator regulator by using the multi-valued signal for communicating test signals.

19. The method of claim 12, further comprising:
programming the alternator regulator by using the multi-valued signal for communicating programming data.

* * * * *